United States Patent [19]
Saruwatari

[11] Patent Number: 5,571,753
[45] Date of Patent: Nov. 5, 1996

[54] METHOD FOR FORMING A WIRING CONDUCTOR IN SEMICONDUCTOR DEVICE

[75] Inventor: Masaru Saruwatari, Kumamoto, Japan

[73] Assignee: NEC Corporation, Tokyo, Japan

[21] Appl. No.: 455,086

[22] Filed: May 31, 1995

[30] Foreign Application Priority Data

May 31, 1994 [JP] Japan ................... 6-119113

[51] Int. Cl.⁶ .................. H01L 21/266; H01L 21/283
[52] U.S. Cl. ............... 437/192; 437/20; 437/200
[58] Field of Search ................... 437/187, 189, 437/190, 192, 200, 20, 29, 34; 257/384, 754

[56] References Cited

U.S. PATENT DOCUMENTS

| | | | |
|---|---|---|---|
| 4,339,869 | 7/1982 | Reihl et al. | 437/200 |
| 4,558,507 | 12/1985 | Okabayashi et al. | 437/200 |
| 4,782,380 | 11/1988 | Shankar et al. | 437/190 |
| 5,094,981 | 3/1992 | Chung et al. | 437/190 |
| 5,102,827 | 4/1992 | Chen et al. | 437/200 |
| 5,369,055 | 11/1994 | Chung | 437/200 |

FOREIGN PATENT DOCUMENTS

| | | |
|---|---|---|
| 1-186668 | 7/1989 | Japan. |
| 4-101416 | 4/1992 | Japan. |

Primary Examiner—T. N. Quach

[57] ABSTRACT

In a method for manufacturing a semiconductor device, after a contact holes are formed to pass through an insulator film, a titanium film and a titanium nitride film are deposited on the whole surface including an inner surface of the contact holes. Thereafter, a contact ion implantation is performed to selectively implant impurity ions to the bottom of the contact hole by using a patterned photoresist as a mask, so that an impurity-implanted region is formed at a substrate surface at a bottom of the contact hole.

6 Claims, 7 Drawing Sheets

METHOD FOR FORMING A WIRING CONDUCTOR IN SEMICONDUCTOR DEVICE

BACKGROUND OF THE INVENTION

1. Field of the Invention

The present invention relates to a method for manufacturing a semiconductor device, and more specifically a method for forming a wiring conductor in a semiconductor device including an $N^+$ diffused layer and a $P^+$ diffused layer, such as a semiconductor device including CMOS transistors.

2. Description of Related Art

With microminiaturization of semiconductor devices, the depth of a junction of an $N^+$ diffused layer and a $P^+$ diffused layer has become shallow in a semiconductor device including CMOS (complementary MOS (metal-oxide-semiconductor field effect transistor)) transistors. In this structure, a contact hole is formed to pass through an insulator film covering the $N^+$ diffused layer and the $P^+$ diffused layer, and a wiring conductor is formed to be connected through the contact hole to the $N^+$ diffused layer or the $P^+$ diffused layer. However, the wiring conductor is apt to break a junction of the $N^+$ diffused layer or the $P^+$ diffused layer. In order to avoid this problem, N type ions and P type ions are implanted at a bottom of the contact hole reaching the $N^+$ diffused layer and the $P^+$ diffused layer (this is called a "contact ion implantation"), and then, a heat treatment is performed to deepen the junction in these portions. In this contact ion implantation, however, the insulator film (and an insulative photoresist film) is electrified with a large amount of electric charges, with the result that an electrostatic destruction is apt to occur for these electric charges.

Japanese Patent Application Laid-open Publication JP-A-1-186668 proposes one semiconductor device manufacturing method capable of preventing the electrostatic destruction caused by the contact ion implantation. The disclosure of JP-A-1-186668 is incorporated by reference in its entirety into the present application. Referring to FIGS. 1A to 1D, there are shown diagrammatic sectional views illustrating this proposed method for manufacturing a semiconductor device, which is as follows:

An N-well 202 is formed in a predetermined region of a surface of a P-type silicon substrate 201 as shown in FIG. 1A. Then, a field oxide film, a gate oxide film and a gate electrode are formed, but are not shown in the drawing for avoiding complication of the drawing. Furthermore, an $N^+$ diffused layer 203 is formed in another predetermined region of the surface of the P-type silicon substrate 201 where the N-well 202 is not formed, and a $P^+$ diffused layer 204 is formed in a predetermined region of a surface of the N-well 202. An insulator film 205 is formed to cover the surface of P-type silicon substrate 201 including the surface of the N-well 202, and a refractory metal film 207 is further formed to cover the insulator film 205. Thereafter, the refractory metal film 207 and the insulator film 205 are selectively and sequentially etched by using a patterned photoresist (not shown) as a mask, so as to form a contact hole 206A reaching the $N^+$ diffused layer 203 and a contact hole 206B reaching the $P^+$ diffused layer 204.

Succeedingly, the patterned photoresist (not shown) is removed, another photoresist 209A covering the contact hole 206B but having an opening in alignment with the contact hole 206A, is formed. A contact ion implantation is performed with a high dose of N-type impurities by using the photoresist 209A (and the insulator film 205) as a mask.

Thus, an ion-implanted N-type region 213 is formed in the surface of the $N^+$ diffused layer 203 at a bottom of the contact hole 206A, as shown in FIG. 1A.

Furthermore, the photoresist 209A is removed, still another photoresist 209B covering the contact hole 206A but having an opening in alignment with the contact hole 206B, is formed. Another contact ion implantation is performed with a high dose of P-type impurities by using the photoresist 209B (and the insulator film 205) as a mask. Thus, an ion-implanted P-type region 214 is formed in the surface of the $P^+$ diffused layer 204 at a bottom of the contact hole 206B, as shown in FIG. 1B.

Thereafter, the photoresist film 209B is removed, and a heat treatment is carried out, so that the ion-implanted N-type region 213 and the ion-implanted P-type region 214 are diffused to form an $N^+$ diffused region 223 and a $P^+$ diffused region 224, as shown in FIG. 1C. The $N^+$ diffused region 223 becomes deeper than the $N^+$ diffused layer 203, and the $P^+$ diffused region 224 becomes deeper than the $P^+$ diffused layer 204.

The aluminum film is deposited to cover a whole surface, and the stacked layer composed of the aluminum film and the refractory metal film 207 are patterned to form wiring conductors 211A and 211B, as shown in FIG. 1D. The wiring conductor 211A is electrically connected through the contact hole 206A to (the $N^+$ diffused region 223 and) the $N^+$ diffused layer 203. This wiring conductor 211A is composed of only aluminum 210A within the contact hole 206A, but of the stacked layer composed of the aluminum film 210A and the refractory metal film 207A, in an area other than the contact hole 206A. Similarly, the wiring conductor 211B is electrically connected through the contact hole 206B to (the $P^+$ diffused region 224 and) the $P^+$ diffused layer 204. This wiring conductor 211B is composed of only aluminum 210B within the contact hole 206B, but of the stacked layer composed of the aluminum film 210B and the refractory metal film 207B, in an area other than the contact hole 206B.

In the above mentioned conventional manufacturing method, JP-A-1-186668 gives such an explanation that, since the refractory metal film 207 exists under the photoresist film 209A in the process for the contact ion implantation, for example when the ion-implanted N-type region 213 is formed, the electrostatic destruction caused by the accumulated electric charges does not occur. However, although an upper edge of the contact hole 206A is covered with the refractory metal film 207, a side surface of the contact hole 206A is defined by the insulator film 205, and therefore, the refractory metal film 207 is not electrically connected to the $N^+$ diffused layer 203. Similarly, the refractory metal film 207 is not electrically connected to the $P^+$ diffused layer 204 in the contact hole 206B. Because of this, the electric charges accumulated on the refractory metal film 207 inevitably discharge between the refractory metal film 207 and the $N^+$ diffused layer 203 or the $P^+$ diffused layer 204. In other words, the method proposed by JP-A-1-186668 is not sufficiently satisfactory in preventing the electrostatic destruction caused in the process of the contact ion implantation.

Japanese Patent Application Laid-open Publication JP-A-4-101416 proposes another semiconductor device manufacturing method capable of preventing the electrostatic destruction caused by the contact ion implantation. The disclosure of JP-A-4-101416 is incorporated by reference in its entirety into the present application. Referring to FIGS. 2A to 2D, there are shown diagrammatic sectional views illustrating this proposed method for manufacturing a semiconductor device, which is as follows:

First, at a predetermined region of a surface of a semiconductor substrate 301 of a first conductivity type, a diffused layer 303 of a second conductivity type opposite to the first conductivity type is formed, and an insulator film 305 is formed to cover the whole surface. Then, a contact hole 306 is formed to pass through the insulator film 305 to reach the diffused layer 303. Furthermore, a photoresist film 309 having an opening of a size larger than that of the contact hole 306, is formed as shown in FIG. 2A.

Next, a refractory metal film 307 is deposited to cover a surface of the photoresist film 309 including an inner surface of the contact hole 306, and then, the contact ion implantation is performed by using the photoresist 309 (and the insulator film 305) as a mask, so that an ion-implanted region 313 of the second conductivity type is formed as shown in FIG. 2B.

Thereafter, the photoresist film 309 is lifted off so that a portion of the refractory metal film 307 in direct contact with the photoresist film 309 is removed, and only the refractory metal film 307A within the opening of the photoresist film 309 remains. Succeedingly, a heat treatment is performed so that the ion-implanted region 313 is activated and converted into a diffusion region 323 and the refractory metal film 307A at the bottom of the contact hole 306 is partially converted into a refractory metal silicide 317, as shown in FIG. 2C.

Furthermore, a metal film is deposited to cover the whole surface, and then, is patterned to form a wiring conductor 311. The wiring conductor 311 is formed of a stacked layer composed of the refractory metal silicide 317, the refractory metal 307A and the metal film 310 within the contact hole 306, but of a stacked layer composed of the refractory metal 307A and the metal film 310 at a periphery of the contact hole 306. In addition, at a region apart from the contact hole 306, the wiring conductor 311 is formed of only the metal film 310.

According to the semiconductor device manufacturing method of JP-A-4-101416, it is possible to prevent certainly the electrostatic destruction in the process of the contact ion implantation. Since a barrier metal film is formed at a bottom of the contact hole in the method of JP-A-4-101416, stability of the contact characteristics is more excellent than the semiconductor device manufacturing method of JP-A-1-186668. However, the method of JP-A-4-101416 can be applied to a semiconductor device including only one conductivity type of diffused layers, but when it is applied to a semiconductor device such as a CMOS semiconductor device, including two different conductivity types of diffused layers such as N-type diffused layers and P-type diffused layers, the following problems have been encountered.

First, the surface of the diffused layer at the bottom of the contact hole is contaminated. This similarly occurs in the semiconductor device manufacturing method of JP-A-1-186668. For example, in the case that the ion-implanted N-type region is formed before the P-type ion-implanted region is formed, the photoresist film (for the lift-off) is in direct contact with the surface of the P-type diffused layer at the bottom of the contact hole reaching the P-type diffused layer until the N-type ion-implanted region is formed. After the photoresist film is lifted off, the refractor metal film remains in the contact hole reaching the N-type diffused layer, and therefore, it is impossible to perform a washing by use of acid or hydrogen peroxide water. Because of this, it is not possible to remove contamination of the P-type diffused layer surface due to the photoresist film.

Secondly, the semiconductor device manufacturing method of JP-A-4-101416 is more complicated than the method of JP-A-1-186668, but is lower than the method of JP-A-1-186668 in a workability of the wiring conductor and in an anti-stress-migration property of the wiring conductor. For example, according to the semiconductor device manufacturing method of JP-A-1-186668, the wiring conductor has a uniform structure in an area other than the contact hole, but according to the semiconductor device manufacturing method of JP-A-4-101416, the wiring conductor includes a single layer or two layers of the refractory metal film in one area but does not include a refractory metal film in another area. This adversely affects the workability of the wiring conductor and lowers the anti-stress-migration property of the wiring conductor.

SUMMARY OF THE INVENTION

Accordingly, it is an object of the present invention to provide a semiconductor device manufacturing method which has overcome the above mentioned defects of the conventional ones.

Another object of the present invention is to provide a semiconductor device manufacturing method, capable of preventing the electrostatic destruction caused in the process of the contact ion implantation, by addition of only a simple process, and capable of reducing the contamination of the diffused layer surface at the bottom of the contact hole, and of patterning the wiring conductor with a high reliability and an excellent workability.

The above and other objects of the present invention are achieved in accordance with the present invention by a method for manufacturing a semiconductor device, comprising:

the step of preparing a semiconductor substrate having a principal surface having a first region of a first conductivity type and a second region of a second conductivity opposite to the first conductivity type;

the step of forming a first diffused layer of the first conductivity type at a predetermined region of a surface of the second region, forming a second diffused layer of the second conductivity type at a predetermined region of a surface of the first region, forming an insulator film coveting the principal surface of the semiconductor substrate, and forming first and second contact holes passing through the insulator film to reach the first diffused layer and the second diffused layer, respectively;

the step of forming a first conductor film containing a refractory metal, to cover a surface of the insulator film including an inner surface of the first and second contact holes;

the step of forming, on the surface of the insulator film, a first resist film having an opening in alignment with the first contact hole but covering the second contact hole, and performing an ion implantation by using the first resist film and the insulator film as a mask, so as to form a first ion-implanted region having impurities of the first conductivity type at the surface of the first diffused layer;

the step of forming, on the surface of the insulator film, a second resist film having an opening in alignment with the second contact hole but covering the first contact hole, and performing an ion implantation by using the second resist film and the insulator film as a mask, so as to form a second ion-implanted region having impurities of the second conductivity type at the surface of the second diffused layer;

the step of performing a heat treatment to activate impurities of the first conductivity type in the first ion-implanted region and impurities of the second conductivity type in the second ion-implanted region, and to form a refractory metal silicide film at the surface of the first diffused layer on a bottom of the first contact hole and at the surface of the second disused layer on a bottom of the second contact hole; and the step of forming a metal film on the whole of the principal surface of the semiconductor substrate, and patterning a multi-layer film composed of the metal film and the first conductor film, so as to form a first wiring conductor connected through the first contact hole to the first diffused layer and a second wiring conductor connected through the second contact hole to the second diffused layer.

In one preferred embodiment, the first conductor film is formed of a titanium film, and the heat treatment is performed in a nitrogen atmosphere, so that a titanium nitride film is grown on the titanium film.

In addition, the first conductor film is formed of a multi-layer film including a first Film and a second film. The first film is composed of a film selected from a group consisting of a titanium film, a tantalum film, a cobalt film, a palladium film or a platinum film, and the second film is composed of a film selected from a group consisting of a titanium nitride film and a titanium-tungsten film.

In another preferred embodiment, after formation of the refractory metal silicide film, but before formation of the metal film, the first conductor film that was not convened into the refractory metal silicide film is removed, and a second conductor film including a refractory metal is formed to cover the surface of the insulator film including the surface of the first and second contact holes. After formation of the metal film, a multi-layer film composed of the metal film and the second conductor film is patterned so as to form the first wiring conductor connected through the first contact hole to the first diffused layer and the second wiring conductor connected through the second contact hole to the second diffused layer.

In this embodiment, the first conductor film is formed of for example, a titanium film, and the heat treatment is performed in a nitrogen atmosphere, so that a titanium nitride film is grown on the titanium film, and wherein the second conductor film is constituted of a film selected from a group consisting of a titanium nitride film and a titanium-tungsten film.

Alternatively, the first conductor film is formed of a film selected frown a group consisting of a titanium film, a tantalum film, a cobalt film, a palladium film or a platinum film, and the second conductor film is constituted of a film selected from a group consisting of a titanium nitride film and a titanium-tungsten film.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
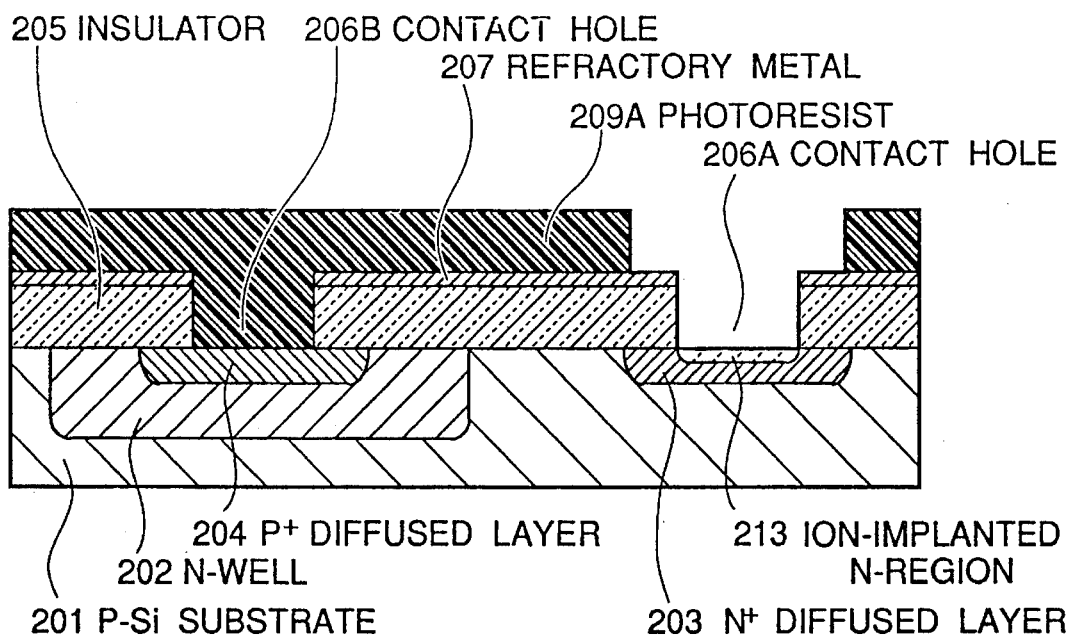
FIGS. 1A to 1D are diagrammatic sectional views illustrating a first conventional method for manufacturing a semiconductor device.

Referring to FIGS. 3A to 3D which are diagrammatic sectional views illustrating a first embodiment of the method in accordance with the present invention for manufacturing a semiconductor device.

In the first embodiment, a P-well 102 is formed in a predetermined region of a surface of an N-type silicon substrate 101. Then, a field oxide film, a gate oxide film and a gate electrode having a gate length on the order of 0.8 μm, are formed, but are not shown in the drawing for avoiding complication of the drawing.

Furthermore, arsenic (As) is ion-implanted with an acceleration energy of 70 KeV and with a dose of $3\times10^{15}cm^{-2}$, so that an $N^+$ diffused layer 103 is formed in a predetermined region of a surface of at least the P-well 102. Incidentally, for a substrate contact, an $N^+$ diffused layer (not shown) is formed in a region of the surface of the N-type silicon substrate 101 where the P-well 102 is not formed. Similarly, boron difluoride ($BF_2$) is ion-implanted with an acceleration energy of 70 KeV and with a dose of $3\times10^{15}cm^{-2}$, so that a $P^+$ diffused layer 104 is formed in another predetermined region of the surface of the N-type silicon substrate 101 where the P-well 102 is not formed. Incidentally, for a well contact, a $P^+$ diffused layer (not shown) is formed in the surface of the P-well 102. The depth (Xjn) of a junction of the $N^+$ diffused layer 103 is on the order of 0.2 μm to 0.3 μm and the depth (Xjp) of a junction of the $P^+$ diffused layer 104 is on the order of 0.3 μm to 0.4 μm.

An insulator film 105 is formed to cover the surface of the N-type silicon substrate 101 including the surface of the P-well 102, and the insulator film 105 is selectively etched by using a photoresist mask (not shown) so that a contact hole 106A reaching the $N^+$ diffused layer 103 and a contact hole 106B reaching the $P^+$ diffused layer 104 are formed to pass through the insulator film 105. A diameter of these contact holes 106A and 106B is on the order of 0.8 μm.

After the photoresist (not shown) is removed, a titanium film 107 having a thickness of about 30 nm and a titanium nitride film 108 having a thickness of about 100 nm are sequentially deposited in the named order by a sputtering and a reactive sputtering, respectively, so as to cover the surface of the insulating film 105 including an exposed surface (bottom surface and side surface) of the contact holes 106A and 106B. The titanium film 107 and the titanium nitride film 108 form a conductive multi-layer film.

Figure 3A:
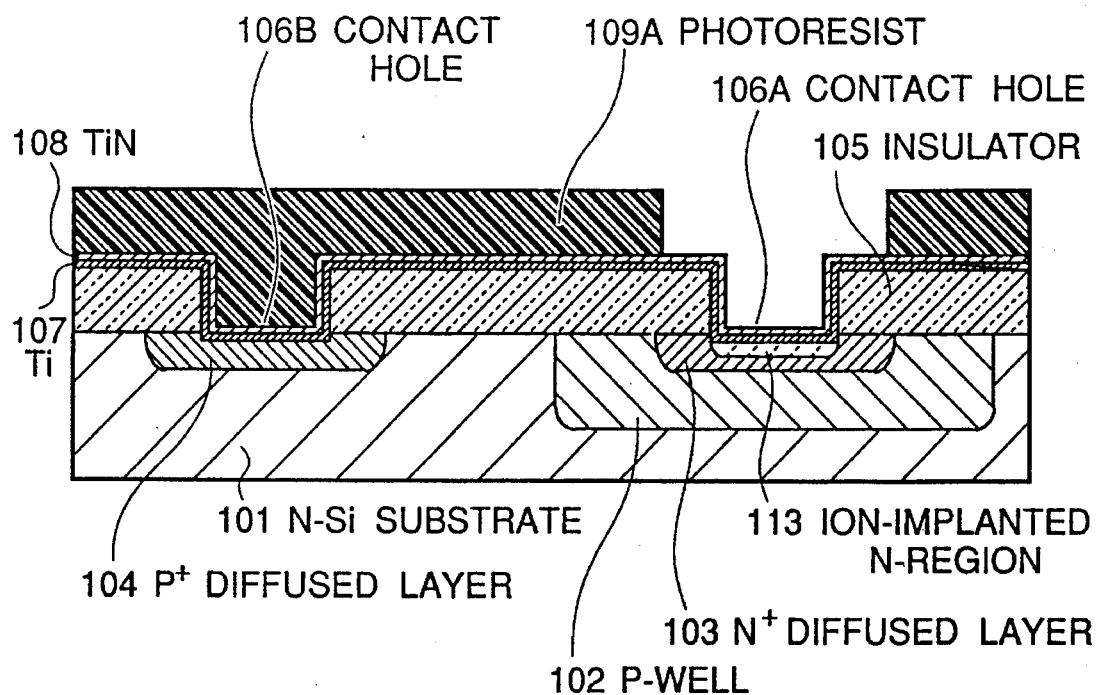
FIGS. 3A to 3D are diagrammatic sectional views illustrating a first embodiment of the method in accordance with the present invention for manufacturing a semiconductor device.
Figure 3B:
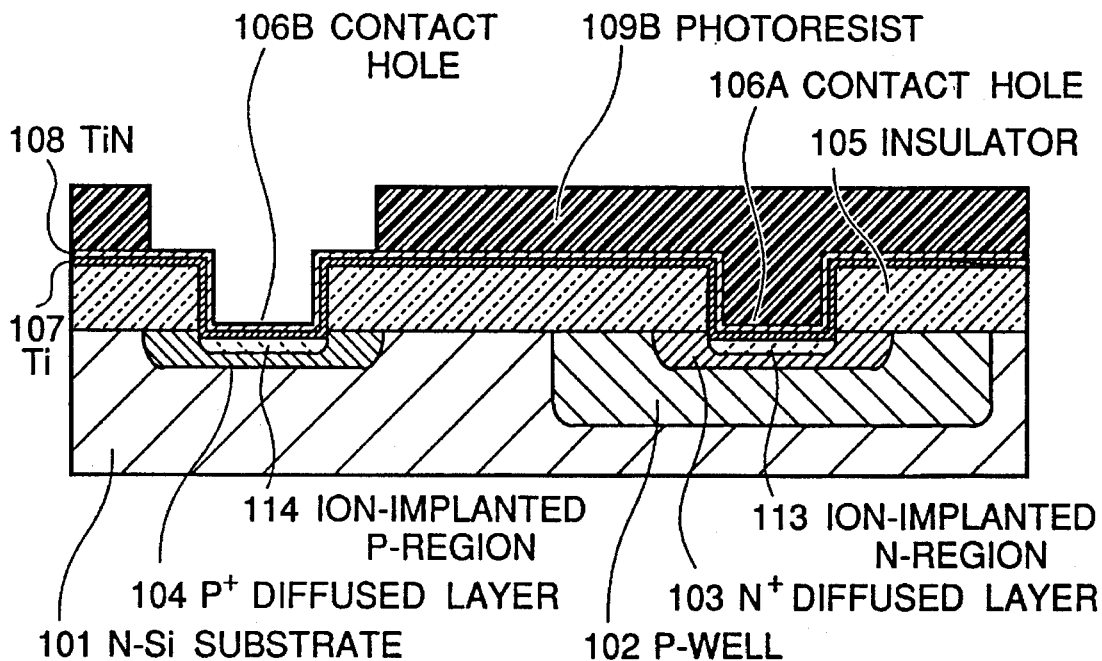

A photoresist 109A (first photoresist) covering the contact hole 106B but having an opening in alignment with the contact hole 106A, is formed. A contact ion implantation of phosphorus (P) is performed with an acceleration energy of 70 KeV to 150 KeV and with a dose of $1\times10^{15}cm^{-2}$ to $1\times10^{16}cm^{-2}$ by using the photoresist 109A (and the insulator film 105) as a mask. Thus, an ion-implanted N-type region 113 is formed in the surface of the $N^+$ diffused layer 103 at a bottom of the contact hole 106A, as shown in FIG. 3A.

Figure 1B:
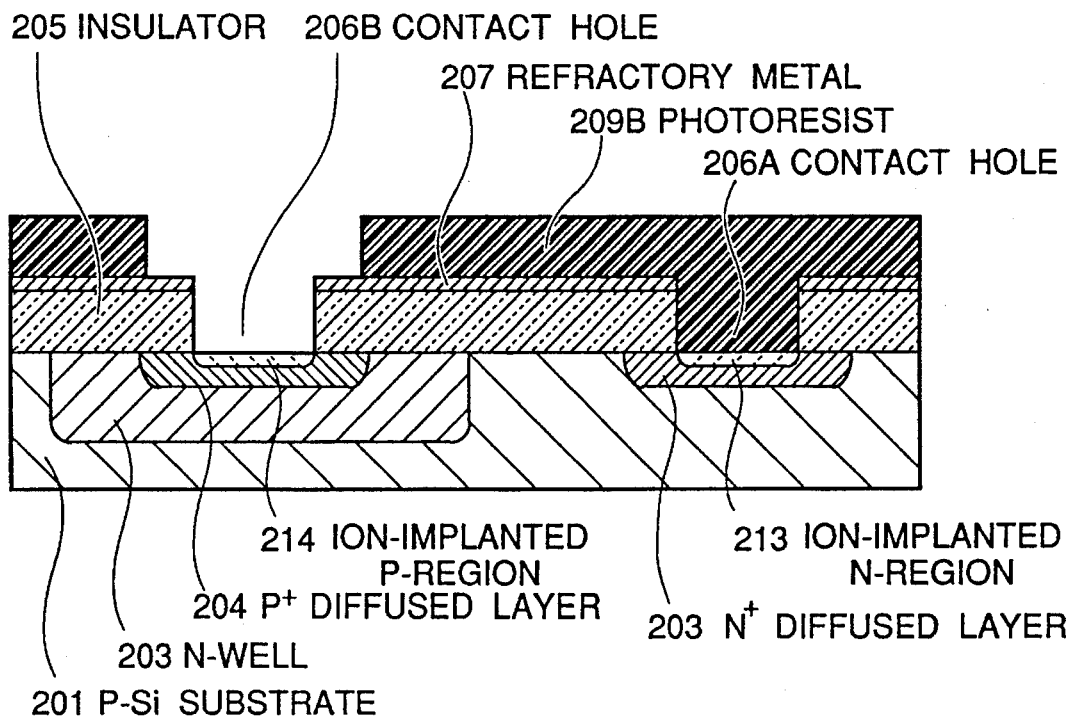
Figure 1C:
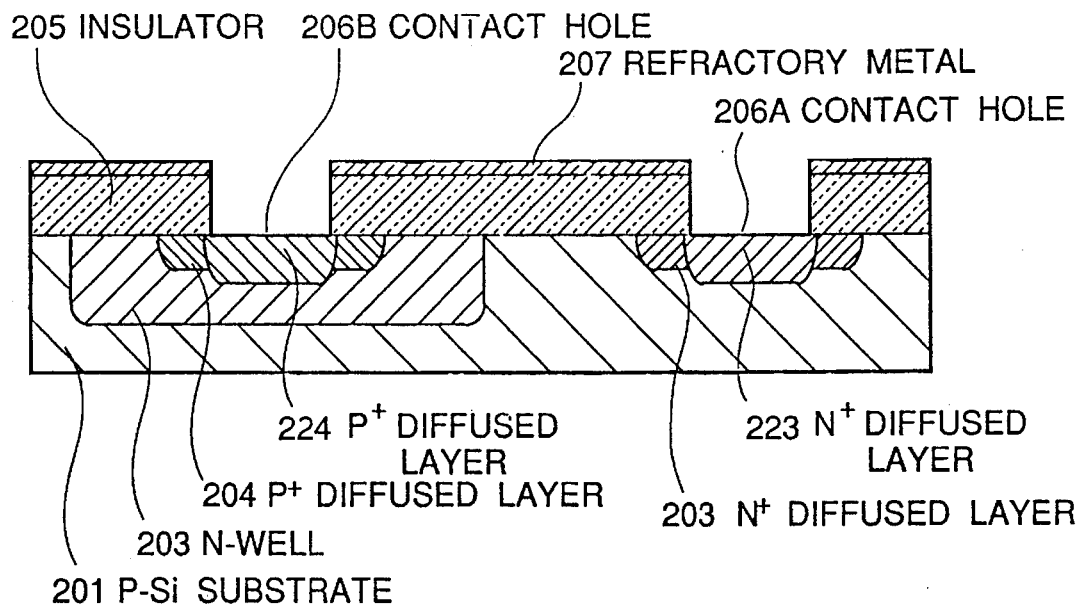
Figure 1D:
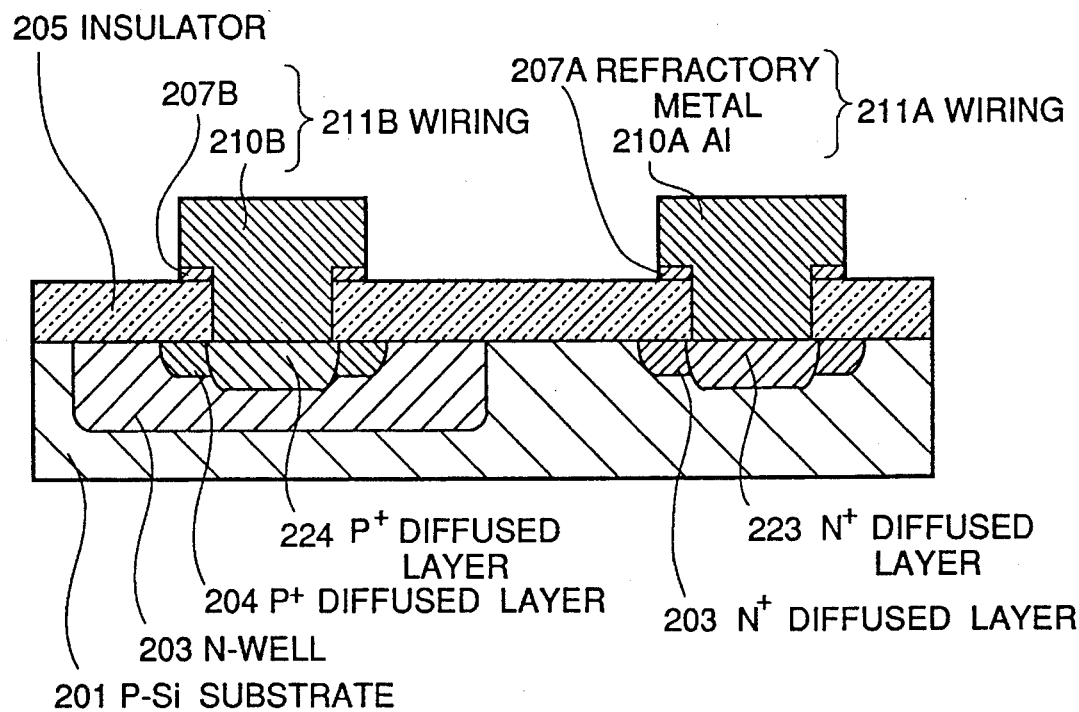
Figure 2A:
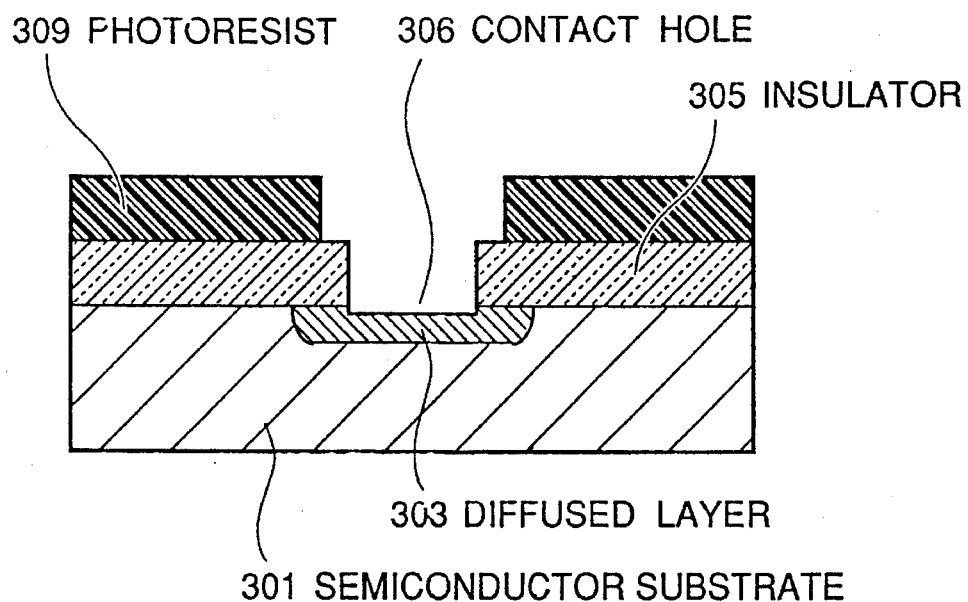
FIGS. 2A to 2D are diagrammatic sectional views illustrating a second conventional method for manufacturing a semiconductor device.
Figure 2B:
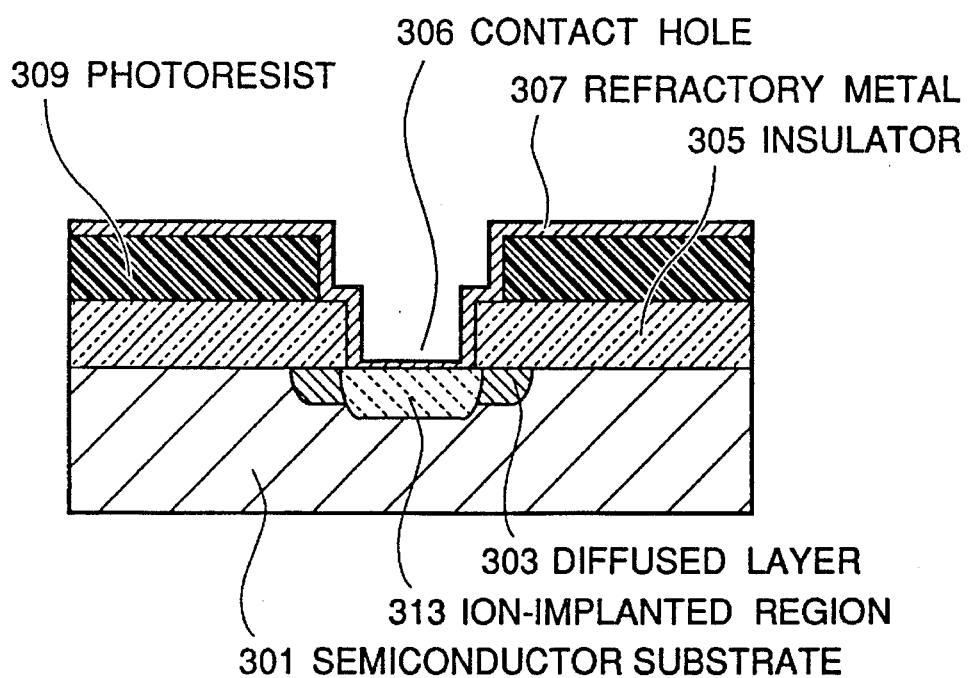
Figure 2C:
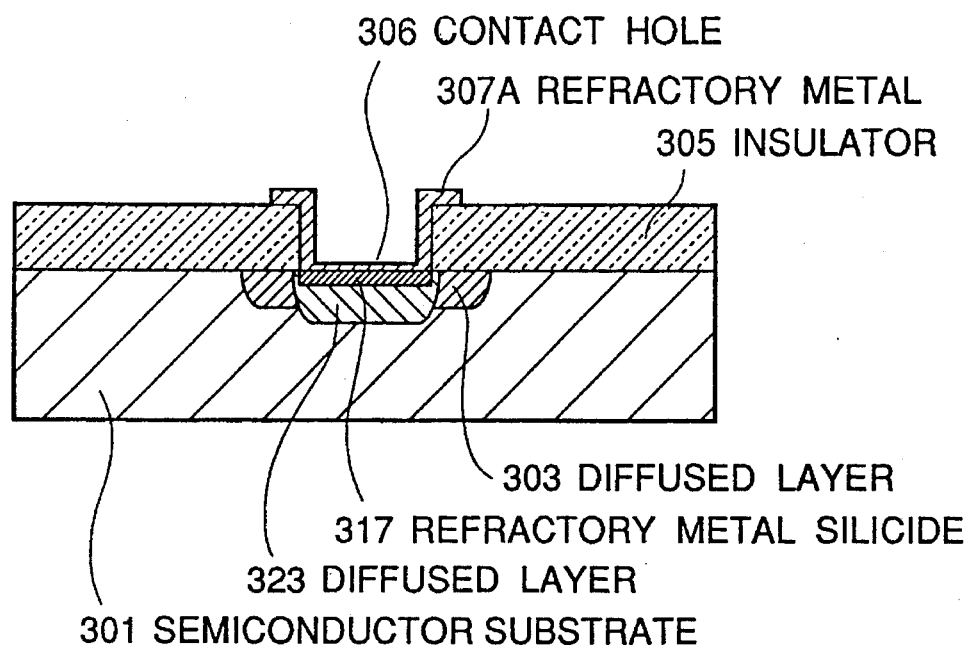
Figure 2D:
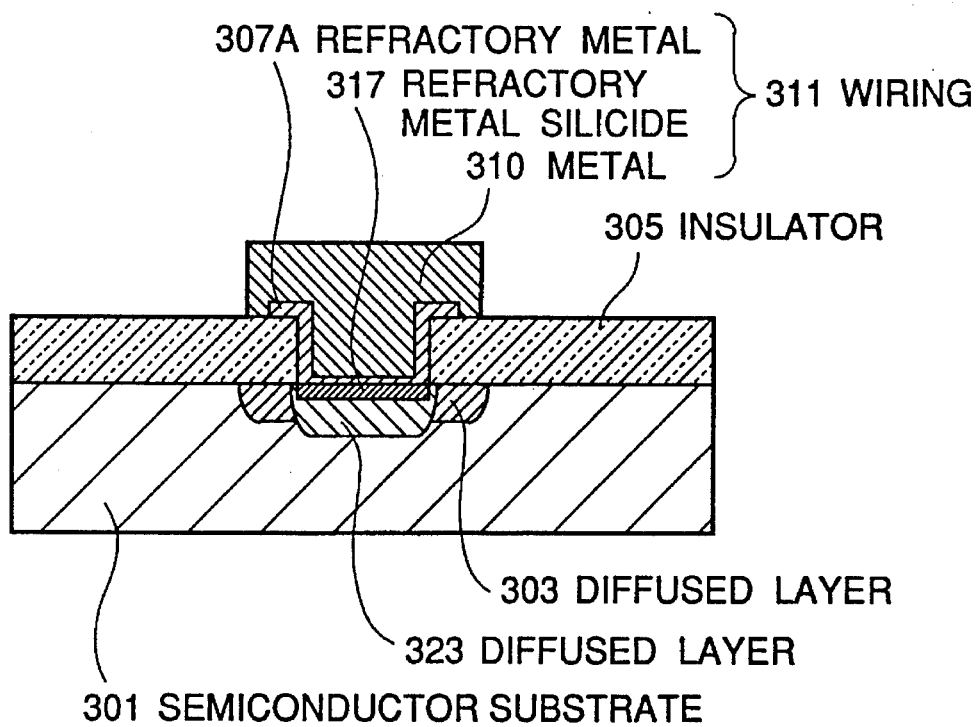

Furthermore, the photoresist 109A is removed, still another photoresist 109B (second photoresist) covering the contact hole 106A but having an opening in alignment with the contact hole 106B, is formed. Another contact ion implantation of boron difluoride is performed with an acceleration energy of 70 KeV to 150 KeV and with a dose of $3\times10^{15}\text{cm}^{-2}$ to $1\times10^{16}\text{cm}^{-2}$ by using the photoresist 109B (and the insulator film 105) as a mask. Thus, an ion-implanted P-type region 114 is formed in the surface of the $P^+$ diffused layer 104 at a bottom of the contact hole 106B, as shown in FIG. 1B.

Figure 3C:
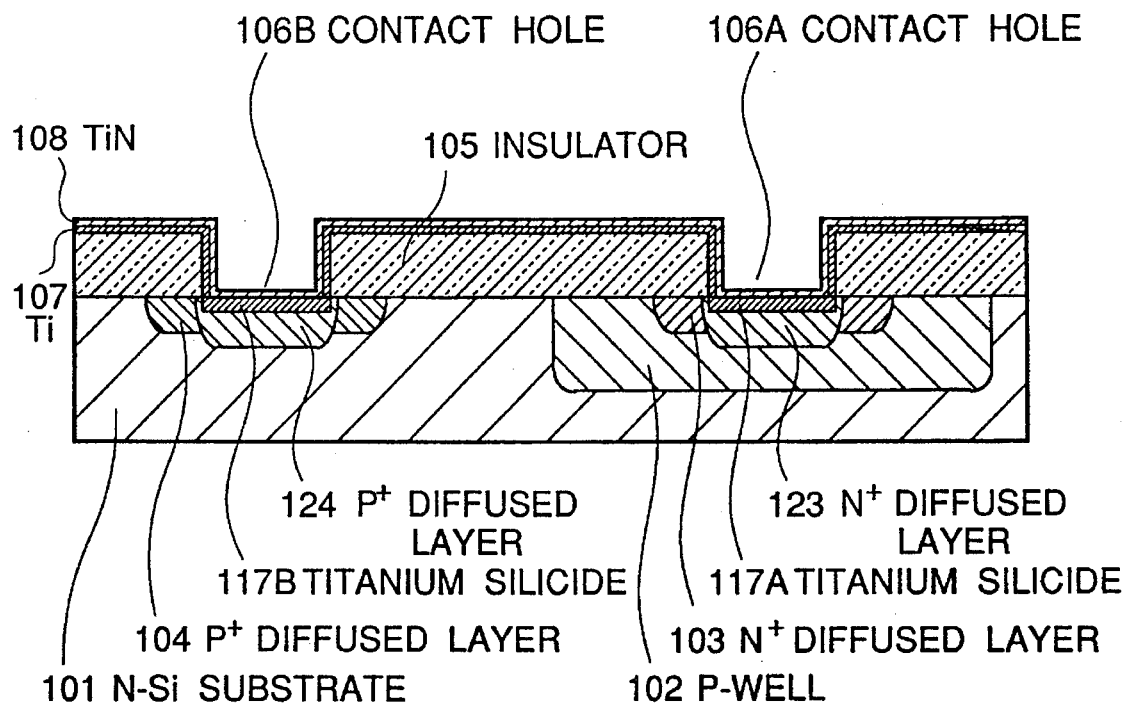

Thereafter, the photoresist film 109B is removed, and a lamp annealing is carried out at a temperature of 700° C. to 800° C. for a period of about two minutes. With this heat treatment, the ion-implanted N-type region 113 and the ion-implanted P-type region 114 are diffused to form an $N^+$ diffused region 123 and a $P^+$ diffused region 124, and the titanium film 107 at the bottom of the contact holes 106A and 106B is converted into titanium silicide film 117A and 117B, respectively, as shown in FIG. 3C. The junction depth XjN of the $N^+$ diffused region 123 is on the order of 0.3 µm to 0.4 µm, and the junction depth Xjp of the $P^+$ diffused region 124 is on the order of 0.4 µm to 0.6 µm.

Figure 3D:
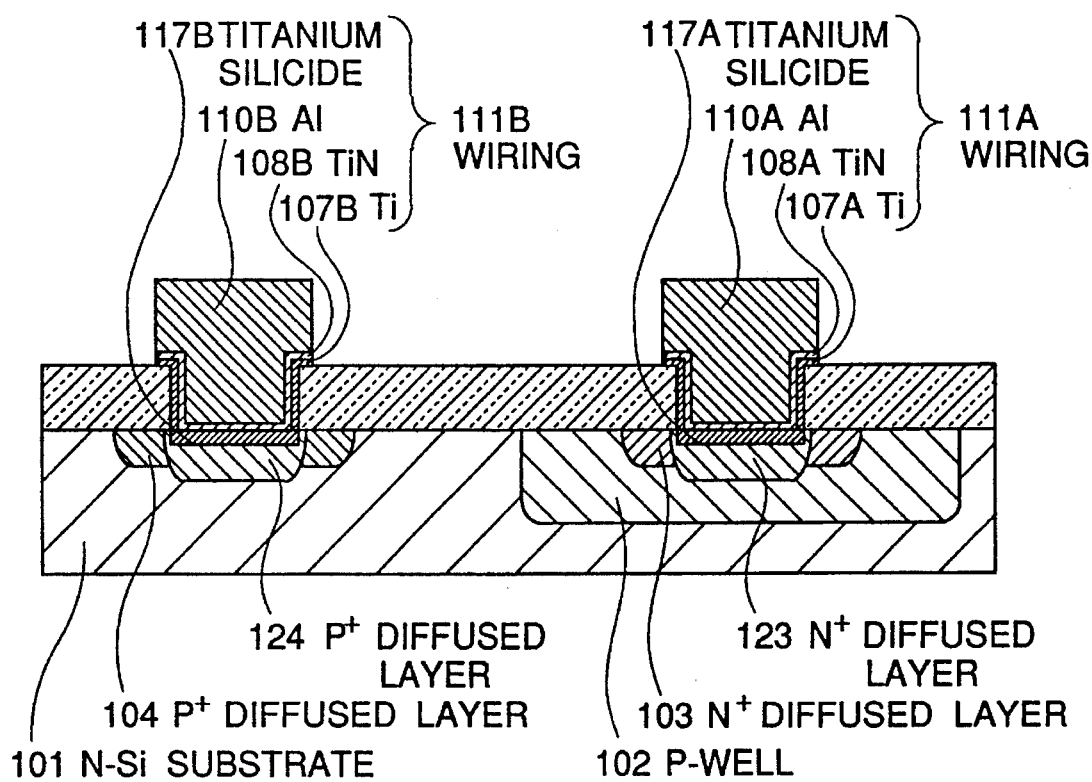

Thereafter, an aluminum film is deposited to cover a whole surface, and the multi-layer film composed of the aluminum film, the titanium nitride film 108 and the titanium film 107 are patterned to form wiring conductors 111A and 111B, as shown in FIG. 3D. The wiring conductor 111A is electrically connected through the contact hole 106A to (the $N^+$ diffused region 123 and) the $N^+$ diffused layer 103. Within the contact hole 106A, this wiring conductor 111A is composed of the multi-layer film composed of the titanium silicide film 117A, the titanium nitride film 108A and the aluminum film 110A. On the other hand, in an area other than the contact hole 106A, the wiring conductor 111A is composed of the multi-layer film composed of the titanium film 107A, the titanium nitride film 108A and the aluminum film 110A.

Similarly, the wiring conductor 111B is electrically connected through the contact hole 106B to (the $P^+$ diffused region 124 and) the $P^+$ diffused layer 104. Within the contact hole 106B, this wiring conductor 111B is composed of the multi-layer film composed of the titanium silicide film 117B, the titanium nitride film 108B and the aluminum film 110B. On the other hand, in an area other than the contact hole 106B, the wiring conductor 111B is composed of the multi-layer film composed of the titanium film 107B, the titanium nitride film 108B and the aluminum film 110B.

In the above mentioned first embodiment, the following advantages can be obtained by adding a simple process of forming the titanium film 107 and the titanium nitride 108 on the whole surface after the contact holes 106A and 106B are formed.

First, since the electrically conductive film consisting of the multi-layer film composed of the titanium film 107 and the titanium nitride film 108 is formed to cover the whole surface before the contact ion implantations are performed for forming the ion-implanted N-type region 113 and the ion-implanted P-type region 114, the electrostatic destruction caused by electric charges accumulated in the photoresist films 109A and 109B and others, can be completely avoided.

In addition, for example, since the above mentioned electrically conductive film exists between the photoresist film 109A and the $P^+$ diffused region 104, the contamination of the $P^+$ diffused region 104 at the bottom of the contact hole 106B by the photoresist film 109A is suppressed.

Furthermore, in a condition before the wiring conductors are formed, a multi-layer film composed of the titanium film 107 and the titanium nitride film 108 exists under the aluminum film at a portion other than the contact hole 106, and a multi-layer film composed of the titanium silicide film 117 A and the titanium nitride film 108 exists under the aluminum film at a portion of the contact hole 106. Therefore, the workability of the wiring conductor 111A is subjected to no adverse influence, and the contact characteristics and the anti-stress-migration property of the wiring conductor 111A do not lower.

In the above mentioned first embodiment, the P-well is formed in the N-type silicon substrate, but the first embodiment is not limited to this construction. The first embodiment can be similarly applied to a case that an N-well is formed in a P-type silicon substrate, another case that a P-well and an N-well are formed in an N-type silicon substrate, and still another case that a P-well and an N-well are formed in a P-type silicon substrate. The order or sequence of the $N^+$ diffused layer formation and the $P^+$ diffused layer, and the order or sequence of the ion-implanted N-type layer formation and the ion-implanted P-type layer are not limited to this embodiment.

In the above mentioned first embodiment, the conductive film is constituted of the multi-layer film consisting of the titanium film 107 and the titanium nitride film 108. One object of use of the titanium film 107 is to improve a bonding or adhesion property between the insulating film 100 and the conductive film, and another object of use of the titanium film 107 is to reduce the contact resistance. An object of use of the titanium nitride film 108 is to suppress a mutual diffusion between the silicon and the aluminum film at the bottom of the contact hole. Respective thicknesses of the titanium film 107 and the titanium nitride film 108 are determined to achieve the above mentioned objects and by taking into consideration the conditions of the two contact ion implantations. Incidentally, in view of the bonding or adhesion property, it is not preferable to use a molybdenum file or a tungsten film at a portion where the conductive film is otherwise in direct contact with the insulator film 105.

In view of the above mentioned objects, the conductive film deposited may be formed of only the titanium film having a predetermined thickness. In this case, the heat treatment is performed in a nitrogen atmosphere, so that a titanium nitride film having a predetermined thickness is grown from the titanium film. In addition, it is possible to use a tantalum film, a cobalt film, a palladium film or a platinum film, in place of the titanium film 107, and also to use a titanium-tungsten film in place of the titanium nitride film 108.

Figure 4A:
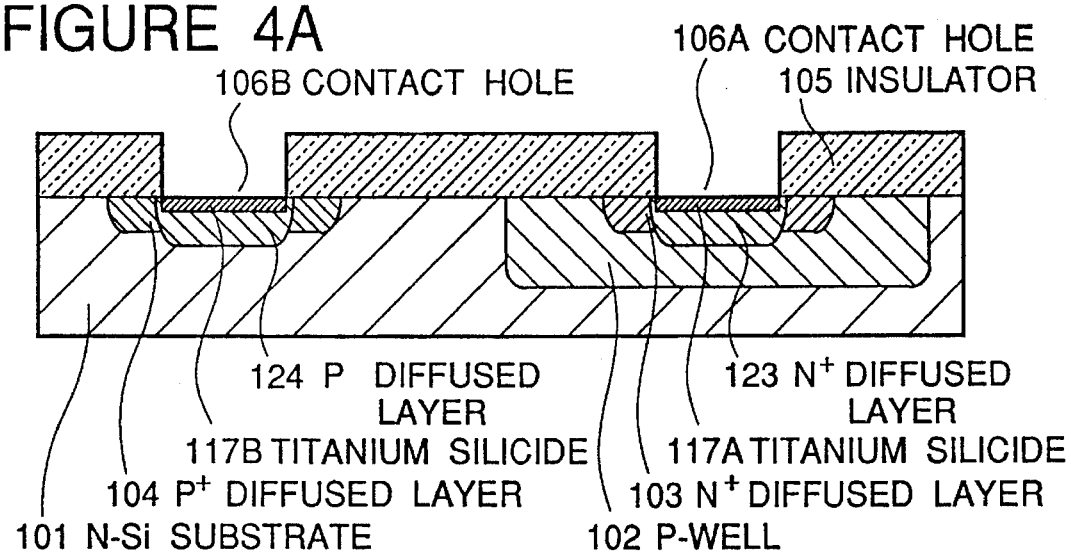
FIGS. 4A to 4C are diagrammatic sectional views illustrating a second embodiment of the method in accordance with the present invention for manufacturing a semiconductor device.
Figure 4B:
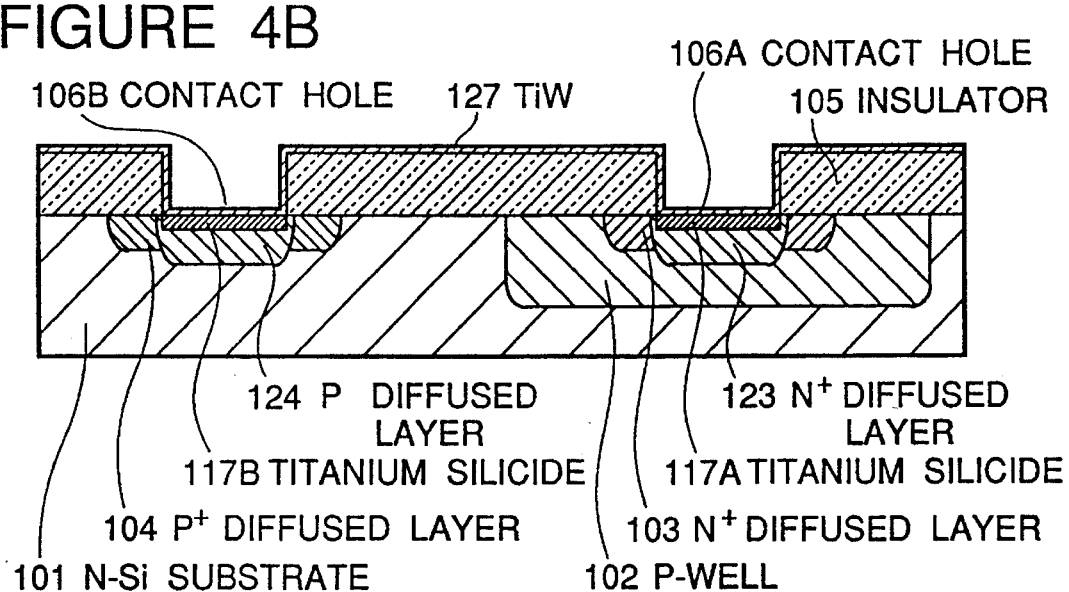
Figure 4C:
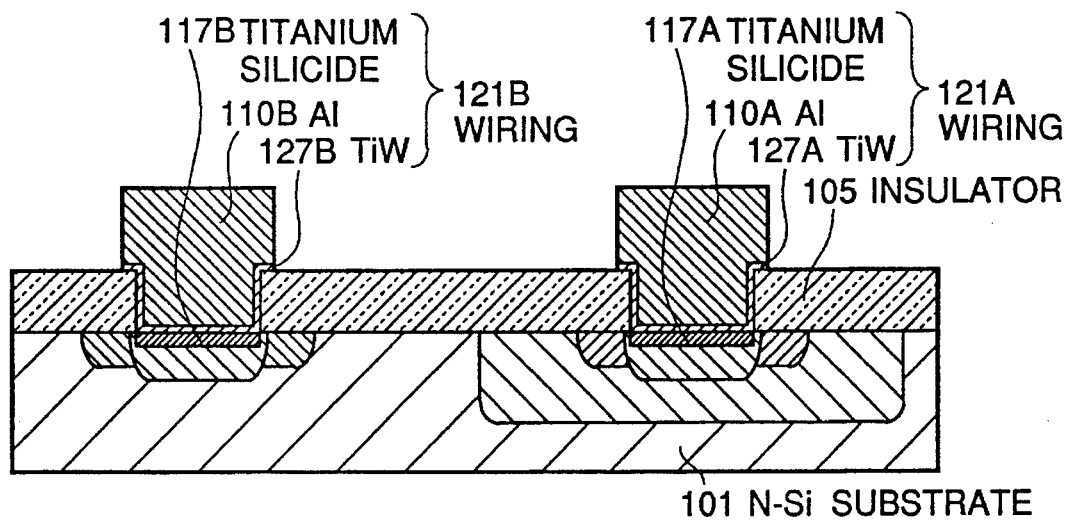

Referring to FIGS. 4A to 4C, there are shown diagrammatic sectional views illustrating a second embodiment of the method in accordance with the present invention for manufacturing a semiconductor device.

The second embodiment is the same as the first embodiment until the formation of the titanium silicide films 117A and 117B as shown in FIG. 3C (but, the thicknesses of the titanium film and the titanium nitride film are not necessarily required to be the same as that of the first embodiment).

Thereafter, the titanium nitride film and the unreacted titanium film are selectively removed by a wet etching using a hydrogen peroxide ($H_2O_2$) water (which may be added with ammonia ($NH_4OH$)), as shown in FIG. 4 A.

Then, a titanium-tungsten film 127 having a thickness of about 100 nm (second conductive film) is deposited on the whole surface by a sputtering.

Succeedingly, similarly to the first embodiment, an aluminum film is deposited to cover a whole surface, and the multi-layer film composed of the aluminum film and the titanium-tungsten film 127 are patterned to form wiring conductors 121A and 121B, as shown in FIG. 4D. The wiring conductor 121A is electrically connected through the contact hole 106A to (the N$^+$ diffused region 123 and) the N$^+$ diffused layer 103. Within the contact hole 106A, this wiring conductor 121A is composed of the multi-layer film composed of the titanium silicide film 117A, the titanium-tungsten film 127A and the aluminum film 110A. On the other hand, in an area other than the contact hole 106A, the wiring conductor 121A is composed of the multi-layer film composed of the titanium-tungsten film 127A and the aluminum film 110A.

Similarly, the wiring conductor 121B is electrically connected through the contact hole 106B to (the P$^+$ diffused region 124 and) the P$^+$ diffused layer 104. Within the contact hole 106B, this wiring conductor 121B is composed of the multi-layer film composed of the titanium silicide film 117B, the titanium-tungsten film 127B and the aluminum film 110B. On the other hand, in an area other than the contact hole 106B, the wiring conductor 121B is composed of the multi-layer film composed of the titanium-tungsten film 127B and the aluminum film 110B.

The second embodiment is different from the first embodiment mainly in that the first conductive film not convened into the silicide is selectively removed, and the second conductive film is newly formed. Accordingly, the number of steps in the second embodiment is larger that that of the first embodiment, however, the newly added steps are not a complicated process. Similarly to the first embodiment, the second embodiment can have the following advantages:

The electrostatic destruction caused by electric charges accumulated in the process for the contact ion implantations, can be completely avoided. In addition, the workabilty of the wiring conductors 121A and 121B is subjected to no adverse influence, and the contact characteristics and the anti-stress-migration property of the wiring conductors 121A and 121B do not lower. Furthermore, the surface contamination of the N$^+$ diffused region 103 and the P$^+$ diffused region by the photoresist films used in the process for the contact ion implantation, is suppressed.

In the second embodiment, moreover, the titanium nitride oxide which constitutes an upper layer of the multi-layer first conductive layer and which therefore is directly exposed in the process for the contact ion implantation or directly covered by the photoresist film. Accordingly, contamination of the conductive film itself, which will constitute a portion of tile wiring conductors 121A and 121B, can be removed.

The second embodiment can be also applied to a case that an N-well is formed in a P-type silicon substrate, another case that a P-well and an N-well are formed in an N-type silicon substrate, and still another case that a P-well and an N-well are formed in a P-type silicon substrate.

Furthermore, the first conductive film may be formed of only the titanium film. In addition, it is possible to use a tantalum film, a cobalt film, a palladium film or a platinum film, in place of the titanium film 107 constituting the first conductive film, and also to use a titanium nitride film in place of the titanium-tungsten film 127 constituting the first conductive film.

As seen from the above, according to the semiconductor device manufacturing method of the present invention, by adding only simple processes, it is possible to avoid the electrostatic destruction which would otherwise have been caused in the process for the contact ion implantation, to reduce the contamination of the diffused layer surface at the bottom of the contact holes, and to be able to form the wiring conductors having a high reliability with an excellent workability.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor device, comprising:

the step of preparing a semiconductor substrate having a principal surface having a first region of a first conductivity type and a second region of a second conductivity opposite to said first conductivity type;

the step of forming a first diffused layer of said first conductivity type at a surface portion of said second region, forming a second diffused layer of said second conductivity type at a surface portion of said first region, forming an insulator film covering said principal surface of said semiconductor substrate, and forming first and second contact holes passing through said insulator film to reach said first diffused layer and said second diffused layer, respectively;

the step of forming a first conductor film which is composed of a refractory metal film and a refractory metal nitride film formed on a surface of said refract or metal film, to cover a surface of said insulator film including an inner surface of said first and second contact holes;

the step of forming, on said surface of said insulator film, a first resist film having an opening in alignment with said first contact hole but covering said second contact hole, and performing an ion implantation of impurities of said first conductivity by using said first resist film and said insulator film as a mask, so as to form a first ion-implanted region having impurities of said first conductivity type at said surface of said first diffused layer;

the step of forming, on said surface of said insulator film, a second resist film having an opening in alignment with said second contact hole but covering said first contact hole, and performing an ion implantation of impurities of said second conductivity by using said second resist film and said insulator film as a mask, so as to form a second ion-implanted region having impurities of said second conductivity type at said surface of said second diffused layer;

the step of performing a heat treatment to activate impurities of said first conductivity type in said first ion-implanted region and impurities of said second conductivity type in said second ion-implanted region, and to form refractory metal silicide film at said surface of said first diffused layer on a bottom of said first contact hole and at said surface of said second diffused layer on a bottom of said second contact hole; and the step of forming a metal film on the whole of said principal surface of said semiconductor substrate, and patterning a multi-layer film composed of said metal film and said first conductor film, so as to form a first wiring conductor connected through said first contact hole to said first diffused layer and a second wiring conductor connected through said second contact hole to said second diffused layer.

2. A method claimed in claim 1 wherein said first conductor film is formed by depositing a titanium film on said surface of said insulator film including said inner surface of said first and second contact holes, and performing a heat treatment for said titanium film in a nitrogen atmosphere, so that a titanium nitride film is grown on said titanium film.

3. A method claimed in claim 1 wherein said first conductor film is formed of a multi-layer film including a first film and a second film deposited in the named order on said surface of said insulator film including said inner surface of said first and second contact holes, said first film being constituted of a film selected from a group consisting of a titanium film, a tantalum film, a cobalt film, a palladium film or a platinum film, and said second film being constituted of a film selected from a group consisting of a titanium nitride film.

4. A method claimed in claim 1 wherein, after formation of said refractory metal silicide film, but before formation of said metal film, said first conductor film that was not converted into said refractory metal silicide film is removed, and a second conductor film including a refractory metal is formed to cover said surface of said insulator film including said surface of said first and second contact holes, and after formation of said metal film, a multi-layer film composed of said metal film and said second conductor film is patterned so as to form said first wiring conductor connected through said first contact hole to said first diffused layer and said second wiring conductor connected through said second contact hole to said second diffused layer.

5. A method claimed in claim 4 wherein said first conductor film is formed of a titanium film, and said heat treatment is performed in a nitrogen atmosphere, so that a titanium nitride film is grown on said titanium film, and wherein said second conductor film is constituted of a film selected from a group consisting of a titanium nitride film and a titanium-tungsten film.

6. A method claimed in claim 4 wherein said first conductor film is formed of a film selected from a group consisting of a titanium film, a tantalum film, a cobalt film, a palladium film or a platinum film, and said second conductor film is constituted of a film selected from a group consisting of a titanium nitride film and a titanium-tungsten film.

* * * * *